US012738448B2

(12) United States Patent
Enomoto et al.

(10) Patent No.: US 12,738,448 B2
(45) Date of Patent: Sep. 15, 2026

(54) CHARGED PARTICLE BEAM DEVICE

(71) Applicant: HITACHI HIGH-TECH CORPORATION, Tokyo (JP)

(72) Inventors: Hirohisa Enomoto, Tokyo (JP); Kenichi Nishinaka, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 357 days.

(21) Appl. No.: 18/700,781

(22) PCT Filed: Dec. 28, 2021

(86) PCT No.: PCT/JP2021/048759
§ 371 (c)(1),
(2) Date: Apr. 12, 2024

(87) PCT Pub. No.: WO2023/127083
PCT Pub. Date: Jul. 6, 2023

(65) Prior Publication Data

US 2024/0404782 A1 Dec. 5, 2024

(51) Int. Cl.
*H01J 37/20* (2006.01)

(52) U.S. Cl.
CPC ..... *H01J 37/20* (2013.01); *H01J 2237/20207* (2013.01); *H01J 2237/20278* (2013.01)

(58) Field of Classification Search
CPC ............. H01J 37/20; H01J 2237/20207; H01J 2237/20278; H01J 37/28; H01J 37/10; H01J 37/244
See application file for complete search history.

(56) References Cited

U.S. PATENT DOCUMENTS 4,559,717 A * 12/1985 Scire .................... G01B 5/0004
33/1 M
5,225,683 A * 7/1993 Suzuki .................... H01J 37/20
250/442.11
(Continued)

FOREIGN PATENT DOCUMENTS

JP 2015220057 A * 12/2001
JP 2004-063463 A 2/2004

OTHER PUBLICATIONS

Ouyang, P. R., Zhang, W. J., & Gupta, M. M. (2008). A new compliant mechanical amplifier based on a symmetric five-bar topology. Journal of Mechanical Design, 130(10), 104501. https://doi.org/10.1115/1.2965600 (Year: 2008).*
(Continued)

*Primary Examiner* — Wyatt A Stoffa
*Assistant Examiner* — Larry Li
(74) *Attorney, Agent, or Firm* — MATTINGLY & MALUR, PC

(57) ABSTRACT

A charged particle beam device includes: an inclination mechanism driving unit configured to generate a driving force; an inclination driving force transmission unit configured to transmit the driving force; and an inclination mechanism unit having first and second load transmission units, first, second and third deformation units, and an inclinable sample holding unit. The first load transmission unit moves in a load direction by the load from the inclination driving force transmission unit and transmits the load to the first deformation unit. The second load transmission unit rotates about the second deformation unit as a fulcrum by a torque generated by deformation of the first deformation unit and transmits the load to the third deformation unit. The sample holding unit rotates about the fourth deformation unit as a fulcrum opposite to a direction of the second load transmis-
(Continued)

sion unit by a torque generated by deformation of the third deformation unit.

13 Claims, 3 Drawing Sheets

(56) References Cited

U.S. PATENT DOCUMENTS

| | | | | |
|---|---|---|---|---|
| 5,296,669 | A * | 3/1994 | Kobayashi | H01J 37/20 250/443.1 |
| 5,806,193 | A * | 9/1998 | Ebihara | G03F 7/70716 33/573 |
| 5,898,177 | A * | 4/1999 | Hidaka | H01J 37/20 250/311 |
| 6,677,595 | B1 * | 1/2004 | Aiba | H01J 37/20 250/442.11 |
| 7,093,827 | B2 * | 8/2006 | Culpepper | F16F 1/027 310/309 |
| 7,791,043 | B2 * | 9/2010 | Seya | H01J 37/20 250/442.11 |
| 8,638,026 | B2 * | 1/2014 | Shibahara | H01J 37/20 310/328 |
| 9,415,508 | B1 * | 8/2016 | Mitchell | H01J 37/20 |
| 11,131,937 | B2 * | 9/2021 | Ronde | G03F 7/70766 |
| 2005/0189901 | A1 * | 9/2005 | Tanaka | B82Y 40/00 318/649 |
| 2007/0063148 | A1 * | 3/2007 | Miyazaki | H01J 37/20 250/442.11 |
| 2010/0230584 | A1 * | 9/2010 | Niebel | H01J 37/263 250/252.1 |
| 2020/0251303 | A1 * | 8/2020 | Fuji | H01J 37/3005 |
| 2021/0287874 | A1 * | 9/2021 | Wang | G01N 23/04 |
| 2024/0309752 | A1 * | 9/2024 | Chery | G01B 5/30 |

OTHER PUBLICATIONS

International Search Report of PCT/JP2021/048759 dated Mar. 22, 2022.

* cited by examiner

[FIG. 1]
(a)
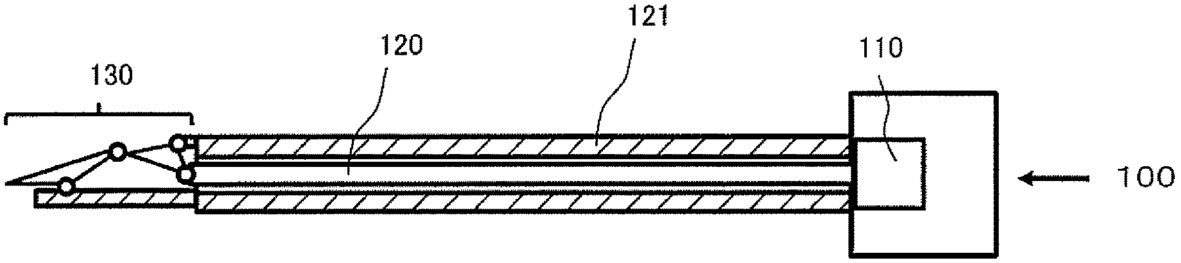
(b)
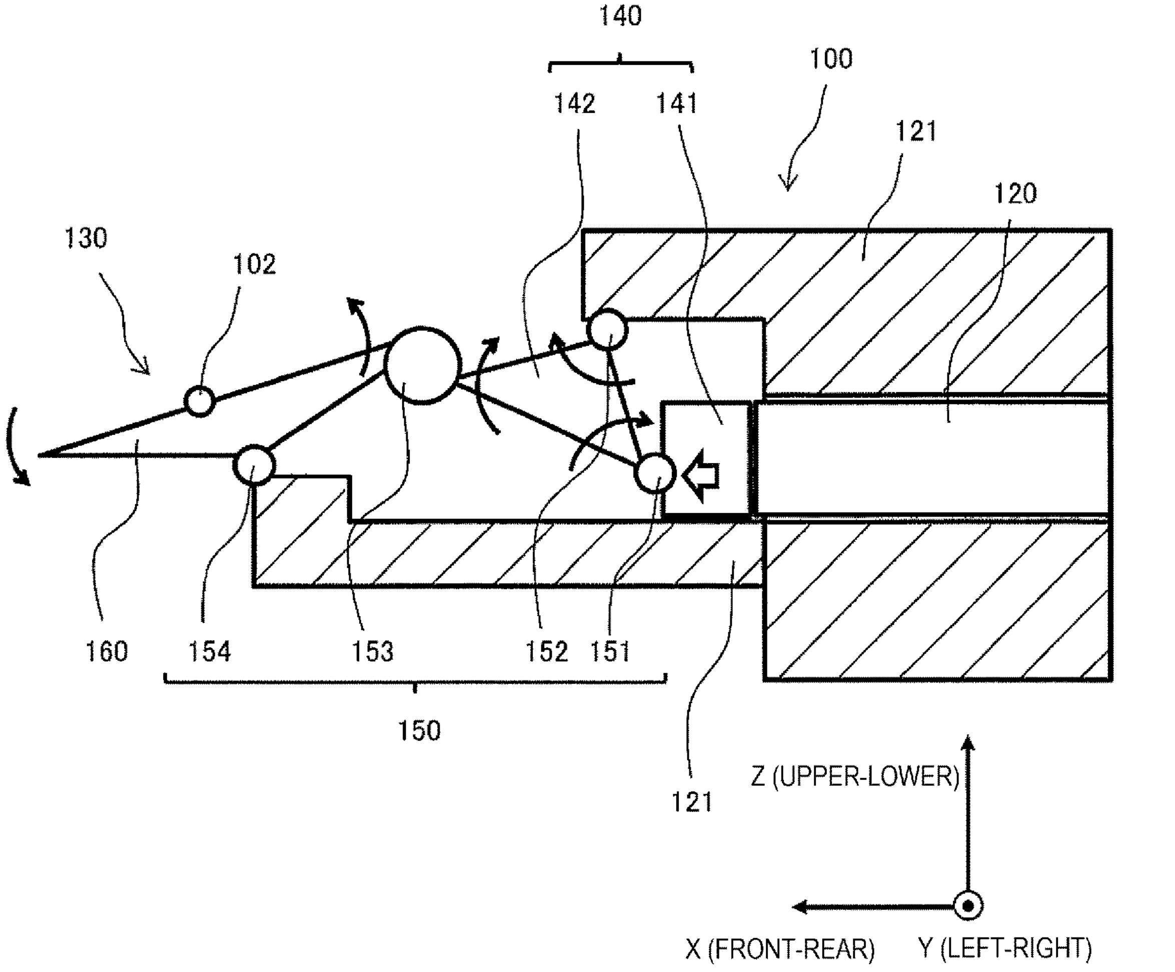

[FIG. 2]
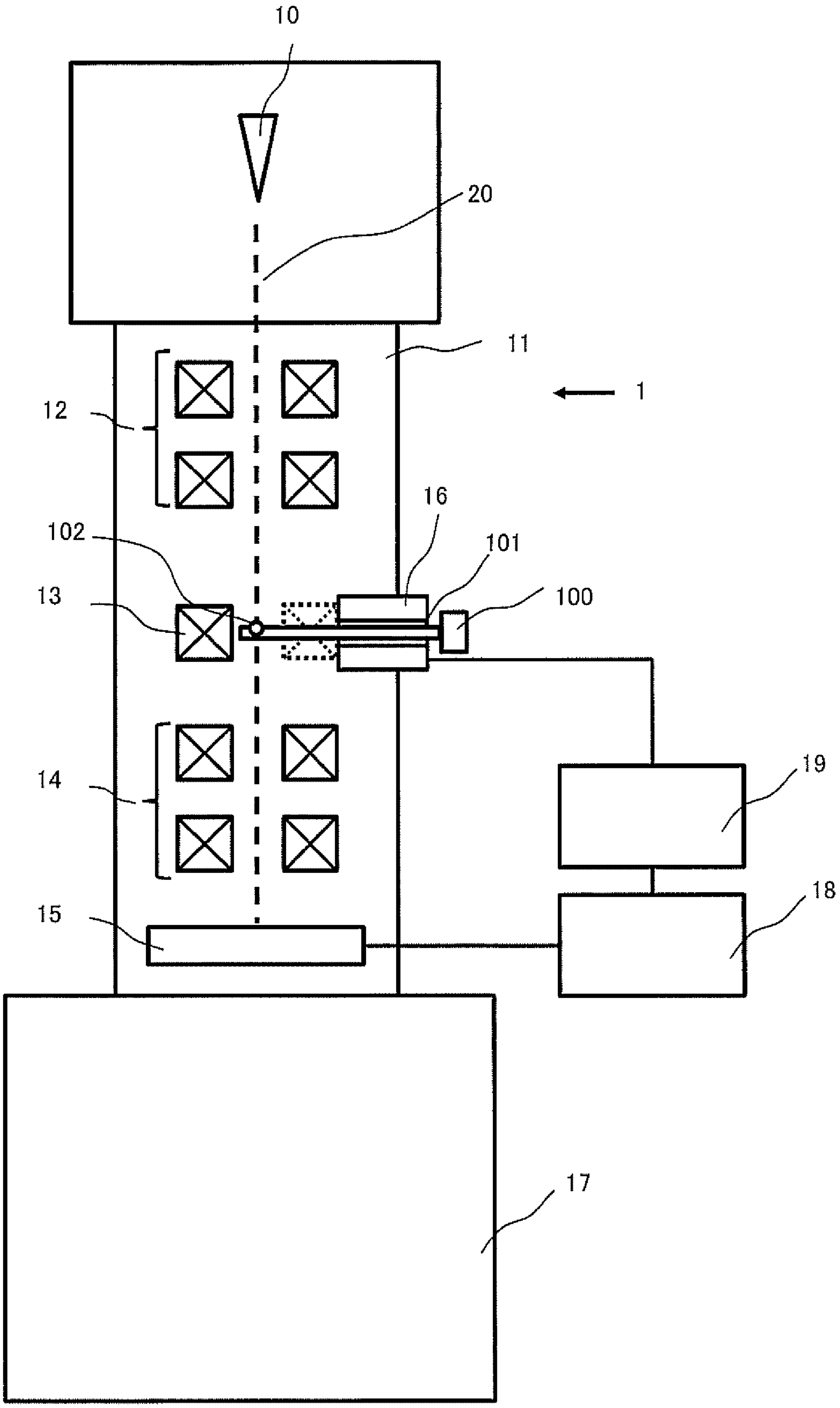

[FIG. 3]
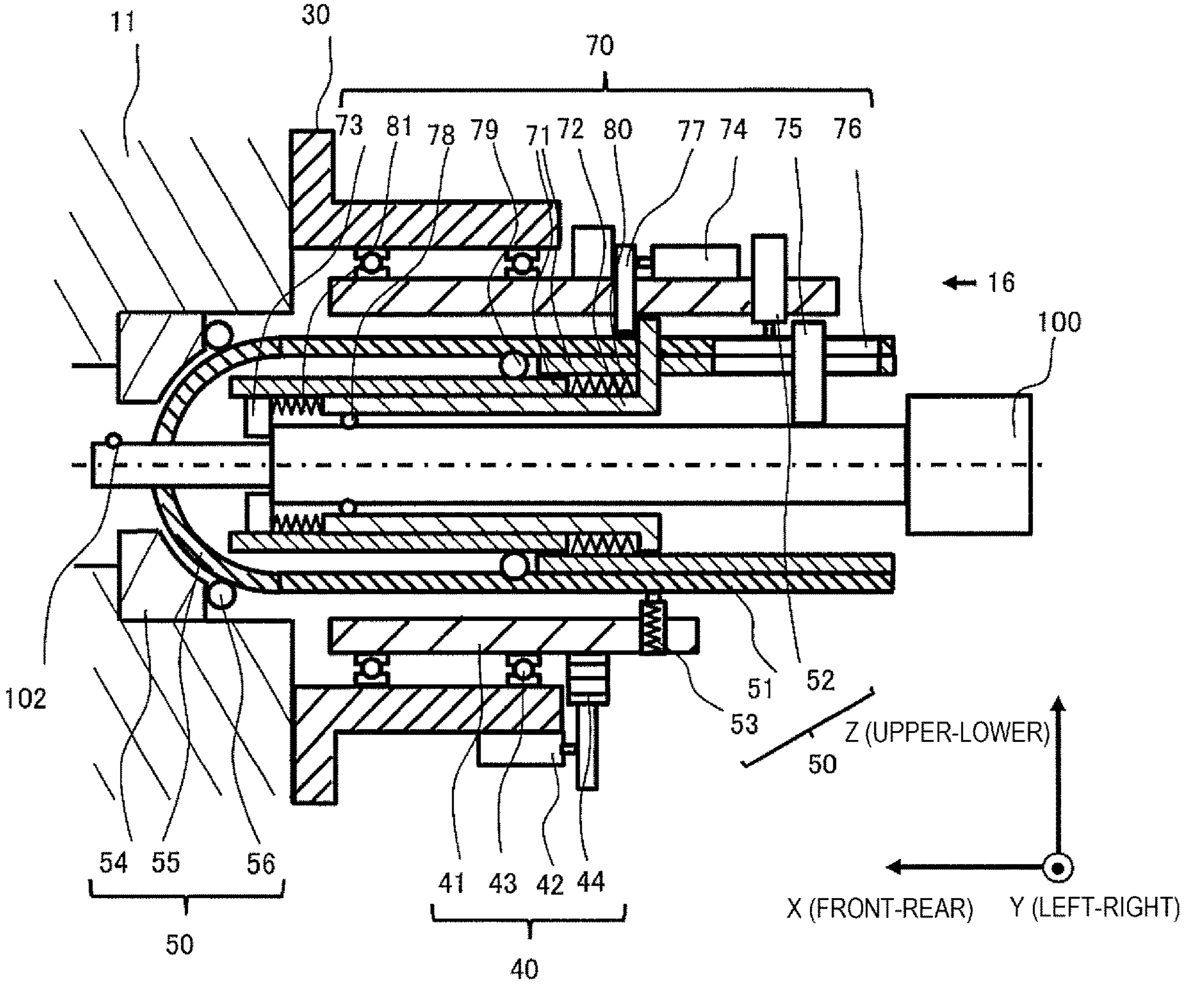

CHARGED PARTICLE BEAM DEVICE

TECHNICAL FIELD

The present invention relates to a charged particle beam device.

BACKGROUND ART

PTL 1 describes a charged particle beam device including an inclination mechanism that inclines an observation sample in a front-rear direction when an insertion direction of a sample holder is defined as the front-rear direction.

PTL 1 describes that "loose tightening considering thermal expansion is performed by a rotation screw 16 on a heating holder side provided on a pivot 4. When the pivot 4 is tightened, a position of a contact portion between an insulator at a tip end of an arm 3 and a recessed surface of a heating stage 1 is aligned. One end of a conducting wire 34 is fixed using a rotation screw 36 attached to the arm 3. Further, the other end of the conducting wire 34 is fixed using a rotation screw 17 of the heating stage 1. As shown in the drawing, the arm 3 is bent like one side of a manji pattern. As the arm 3 rotates, the pivot 4 rotates in a front-rear direction about an axis.".

CITATION LIST

Patent Literature

PTL 1: JP2004-63463A

SUMMARY OF INVENTION

Technical Problem

However, in the related art, there is a problem that nonlinear characteristics affect positioning accuracy in a mechanism for inclining a sample.

PTL 1 describes a charged particle beam device including a mechanism in which a sample is mounted on a heating stage and is inclined. However, since the inclination mechanism of the sample described in PTL 1 rotates due to relative displacement between two different members, the nonlinear characteristics (nonlinear gain, backlash, and frictional force) of the mechanism generated between the two movable members reduce the positioning accuracy.

An object of the invention is to provide a charged particle beam device capable of performing an inclination operation without nonlinear characteristics affecting positioning accuracy by eliminating a sliding portion (pivot or the like) of a rotation shaft in a mechanism for inclining a sample.

Solution to Problem

An example of a charged particle beam device according to the invention includes:

- an inclination mechanism driving unit configured to generate a driving force;
- an inclination driving force transmission unit configured to transmit the driving force; and
- an inclination mechanism unit configured to perform an inclination operation, in which
- the inclination mechanism unit includes
  - a first load transmission unit and a second load transmission unit configured to transmit a load from the inclination driving force transmission unit,
  - a first deformation unit, a second deformation unit, a third deformation unit, and a fourth deformation unit configured to be elastically deformed by the load, and
  - a sample holding unit configured to hold and incline a sample,
- the first deformation unit, the second deformation unit, and the third deformation unit are attached to the second load transmission unit,
- the third deformation unit is
  - above the first deformation unit and the fourth deformation unit,
  - below the second deformation unit,
  - in front of the first deformation unit, and
  - behind the fourth deformation unit,
- the first load transmission unit is configured to move in a load direction by the load from the inclination driving force transmission unit and transmit the load to the first deformation unit,
- the second load transmission unit is configured to rotate about the second deformation unit as a fulcrum by a torque generated by deformation of the first deformation unit and transmit the load to the third deformation unit, and
- the sample holding unit is configured to rotate about the fourth deformation unit as a fulcrum in a direction opposite to a direction of the second load transmission unit by a torque generated by deformation of the third deformation unit.

An example of a sample holder according to the invention includes:

- an inclination mechanism driving unit configured to generate a driving force;
- an inclination driving force transmission unit configured to transmit the driving force; and
- an inclination mechanism unit configured to perform an inclination operation, in which
- the inclination mechanism unit includes
  - a first load transmission unit and a second load transmission unit configured to transmit a load from the inclination driving force transmission unit,
  - a first deformation unit, a second deformation unit, a third deformation unit, and a fourth deformation unit configured to be elastically deformed by the load, and
  - a sample holding unit configured to hold and incline a sample,
- the first deformation unit, the second deformation unit, and the third deformation unit are attached to the second load transmission unit,
- the third deformation unit is
  - above the first deformation unit and the fourth deformation unit,
  - below the second deformation unit,
  - in front of the first deformation unit, and
  - behind the fourth deformation unit,
- the first load transmission unit is configured to move in a load direction by the load from the inclination driving force transmission unit and transmit the load to the first deformation unit,
- the second load transmission unit is configured to rotate about the second deformation unit as a fulcrum by a torque generated by deformation of the first deformation unit and transmit the load to the third deformation unit, and
- the sample holding unit is configured to rotate about the fourth deformation unit as a fulcrum in a direction opposite to a direction of the second load transmission unit by a torque generated by deformation of the third deformation unit.

An example of a sample insertion structure according to the invention includes:

a sample holder; and a sample stage, in which the sample holder includes an inclination mechanism driving unit configured to generate a driving force, an inclination driving force transmission unit configured to transmit the driving force, and an inclination mechanism unit configured to perform an inclination operation, the sample holder is configured to be inserted into the sample stage, the inclination mechanism unit includes a first load transmission unit and a second load transmission unit configured to transmit a load from the inclination driving force transmission unit, a first deformation unit, a second deformation unit, a third deformation unit, and a fourth deformation unit configured to be elastically deformed by the load, and a sample holding unit configured to hold and incline a sample, the first deformation unit, the second deformation unit, and the third deformation unit are attached to the second load transmission unit, the third deformation unit is above the first deformation unit and the fourth deformation unit, below the second deformation unit, in front of the first deformation unit, and behind the fourth deformation unit, the first load transmission unit is configured to move in a load direction by the load from the inclination driving force transmission unit and transmit the load to the first deformation unit, the second load transmission unit is configured to rotate about the second deformation unit as a fulcrum by a torque generated by deformation of the first deformation unit and transmit the load to the third deformation unit, and the sample holding unit is configured to rotate about the fourth deformation unit as a fulcrum in a direction opposite to a direction of the second load transmission unit by a torque generated by deformation of the third deformation unit.

In an example of a method of controlling a position of a sample using a sample holder according to the invention, the sample holder includes an inclination mechanism driving unit configured to generate a driving force, an inclination driving force transmission unit configured to transmit the driving force, and an inclination mechanism unit configured to perform an inclination operation, the inclination mechanism unit includes a first load transmission unit and a second load transmission unit configured to transmit a load from the inclination driving force transmission unit, a first deformation unit, a second deformation unit, a third deformation unit, and a fourth deformation unit configured to be elastically deformed by the load, and a sample holding unit configured to hold and incline a sample, the first deformation unit, the second deformation unit, and the third deformation unit are attached to the second load transmission unit, the third deformation unit is above the first deformation unit and the fourth deformation unit, below the second deformation unit, in front of the first deformation unit, and behind the fourth deformation unit, the method includes:

a step of moving the first load transmission unit in a load direction by the load from the inclination driving force transmission unit and transmitting the load to the first deformation unit;

a step of rotating the second load transmission unit about the second deformation unit as a fulcrum by a torque generated by deformation of the first deformation unit and transmitting the load to the third deformation unit; and a step of rotating the sample holding unit about the fourth deformation unit as a fulcrum in a direction opposite to a direction of the second load transmission unit by a torque generated by deformation of the third deformation unit.

Advantageous Effects of Invention

According to the invention, since an inclination mechanism does not include a sliding portion of a rotation shaft, nonlinear characteristics are reduced in an inclination operation of a sample in a charged particle beam device.

Problems, configurations, and effects other than those described above will become apparent by description of the following embodiments.

BRIEF DESCRIPTION OF DRAWINGS

FIG. 1 is a side view of a sample holder of a charged particle beam device and an inclination mechanism unit of a sample according to Embodiment 1 of the invention.

FIG. 2 is a schematic side view showing an overall configuration example of the charged particle beam device according to Embodiment 1.

FIG. 3 is a schematic side view of a sample stage according to Embodiment 1.

DESCRIPTION OF EMBODIMENTS

Hereinafter, embodiments will be described with reference to the drawings.

Embodiment 1

Hereinafter, Embodiment 1 of the invention will be described with reference to FIGS. 1 to 3.

FIG. 2 is a schematic side view showing an overall configuration example of a charged particle beam device according to Embodiment 1. In Embodiment 1, a transmission electron microscope will be described as an example of the charged particle beam device.

A charged particle beam device 1 in FIG. 2 includes an electron gun 10, a mirror body 11, and a base 17 in this order from the top in a vertical direction. An irradiation lens system 12, an objective lens 13, an image forming lens system 14, and a detector 15 are built in the mirror body 11 in this order from the top in the vertical direction.

A sample stage 16 is disposed at the same height as the objective lens 13 on a side surface of the mirror body 11. The charged particle beam device 1 includes a sample holder 100 on which a sample 102 is disposed. The sample stage 16 includes an insertion unit 101 for inserting the sample holder 100, and the sample holder 100 can be inserted into the sample stage 16. Accordingly, the sample 102 disposed in the sample holder 100 can be inserted into the objective lens 13. The sample holder 100 and the sample stage 16 form a sample insertion structure. The sample holder 100 is used to control a position of the sample by a method described in this specification.

In addition, the base 17 below the mirror body 11 supports the entire charged particle beam device 1 including the mirror body 11.

The charged particle beam device 1 further includes a main control unit 18 that controls the entire charged particle beam device 1, and a stage controller 19 (control unit) that controls the sample stage 16.

In order to obtain an observation image of the sample 102, an electron beam 20 accelerated from the electron gun 10 is emitted toward the mirror body 11, and is further emitted onto the sample 102 on the sample holder 100 while being focused by the irradiation lens system 12 and the objective lens 13. The electron beam 20 transmitted through the sample 102 is enlarged by the image forming lens system 14 and then detected by the detector 15. An electrical signal from the detector 15 is taken into the main control unit 18 and imaged.

The sample holder 100 is inserted into the mirror body 11 from the insertion unit 101 of the sample stage 16. The sample holder 100 moves the disposed sample 102. The sample holder 100 is provided with an inclination mechanism unit 130 (see FIG. 1) described later, and the insertion unit 101 operates to insert the inclination mechanism unit 130 into the charged particle beam device 1 (for example, into the mirror body 11). With such a configuration, the sample 102 can be inserted into an appropriate position.

The stage controller 19 transmits a control signal for controlling the inclination mechanism unit 130. In addition, the position of the sample holder 100 is controlled by the control signal from the stage controller 19. Accordingly, an irradiation position of the electron beam 20 with respect to the sample 102 can be moved by moving the sample 102 to a desired position.

Although not shown, an operation of inserting the sample holder 100 into the sample stage 16 is not limited to a manual operation, and an automatic transport device or the like may be used.

In addition, as long as a sample position after the insertion of the sample holder 100 can be moved to an appropriate position in the mirror body 11, the insertion unit 101 does not need to be in the sample stage 16, and may be at a position other than the sample stage 16 in the mirror body 11.

The configuration of the charged particle beam device is not limited to the above.

FIG. 3 is a schematic side view of the sample stage 16 according to the invention. In the embodiment, in a coordinate system, an insertion direction of the sample holder is an X-axis (front-rear), a horizontal axis orthogonal to the X-axis is a Y-axis (left-right), and a vertical axis is a Z-axis (upper-lower). An orientation of the coordinate system can be set freely.

The sample stage 16 in FIG. 3 includes a base 30 that supports the entire sample stage, an X-axis rotation mechanism 40 that rotates about the X-axis, a Z-direction operation mechanism 50 that operates substantially in a Z-axis direction, a Y-direction operation mechanism (not shown) that operates substantially in a Y-axis direction, and an X-axis linear movement mechanism 70 that linearly moves in an X-axis direction. The sample holder 100 on which the sample 102 is disposed is inserted into the sample stage 16.

In the specification, a coordinate origin is not specified, and the expression “rotates about the X-axis” may represent rotation in a YZ plane about any point. In addition, the expression “operates substantially in a Z-axis direction” is not limited to a strictly linear operation in the Z-axis direction, and includes an operation in which one end of a member moves along a curved trajectory to a degree that can be roughly approximated by a straight line, and includes, for example, a rotation operation in an XZ plane. The same applies to the expression “operates substantially in a Y-axis direction”.

The base 30 has a substantially cylindrical shape, and fixes the sample stage 16 to the side surface of the mirror body 11.

The X-axis rotation mechanism 40 includes a movable unit, a driving unit, an operation guide unit, a driving force transmission unit, and a position measurement unit, and is disposed on the base 30.

The X-axis rotation mechanism 40 includes a cylindrical rotation cylinder 41 (movable unit) that rotates, an X-axis rotation driving unit 42 (driving unit) that generates a rotation driving force, a bearing 43 (operation guide unit) that guides a rotation operation, a gear 44 (driving force transmission unit) that transmits the rotation driving force to the movable unit, and an encoder (not shown, position measurement unit).

The rotation cylinder 41 is built in the base 30, the X-axis rotation driving unit 42 is fixed on the base 30, the bearing 43 is disposed between the base 30 and the rotation cylinder 41, and the gear 44 is disposed in the rotation cylinder 41 (for example, in the vicinity of a rear end thereof).

An operation of the X-axis rotation mechanism will be described. First, according to a driving signal from the stage controller 19, the X-axis rotation driving unit 42 such as a motor rotates, a rotation force is transmitted to the gear 44 at the rear end of the rotation cylinder, and the rotation cylinder 41 rotates about the X-axis using the bearing 43 as a rotation guide. Accordingly, the sample holder 100, which is supported by an outer cylinder 51 connected to a part of the rotation cylinder 41, and the sample 102 at a tip end thereof also rotate about the X-axis.

The Z-direction operation mechanism 50 includes a movable unit, a driving unit, an operation guide unit, a position measurement unit, and a vacuum sealing unit, and is disposed on the rotation cylinder.

The Z-direction operation mechanism 50 includes the outer cylinder 51 (movable unit) that operates substantially in the Z-axis direction, a Z-axis operation driving unit 52 that generates an operation driving force in the substantially Z-axis direction, a counter spring 53 (driving unit) that generates an against force of the driving force at the time of deformation, a spherical receiver 54 and a spherical fulcrum 55 (operation guide unit) that guide an operation in the substantially Z-axis direction, a spherical fulcrum O-ring 56 (vacuum sealing unit), and an encoder (not shown, position measurement unit). Since the driving unit directly acts on the movable unit, there is no transmission unit.

Although the Z-direction operation mechanism 50 strictly rotates the outer cylinder 51 about the Y-axis, when a rotation range is narrow, it can be interpreted that the sample 102 is substantially linearly moved in the Z-axis direction.

The outer cylinder 51 is built in the rotation cylinder 41, the Z-axis operation driving unit 52 and the counter spring 53 are fixed on the rotation cylinder 41, the spherical fulcrum 55 is disposed at a front end (inside the mirror body) of the outer cylinder 51, and the spherical receiver 54 is disposed on the mirror body 11 side.

The operation of the Z-direction operation mechanism 50 will be described below. The Z-axis operation driving unit 52 extends and contracts according to the driving signal from the stage controller 19. The Z-axis operation driving unit 52 may be a linearly moving unit, and may be, for example, a linear actuator. A linear movement force during extension and contraction of the Z-axis operation driving unit 52 directly presses a rear end (outer side) of the outer cylinder 51, so that the linear movement force serves as a force point of a lever, and the outer cylinder 51 is inclined about the Y-axis with the spherical fulcrum 55 and the spherical receiver 54 as a fulcrum. Accordingly, the sample holder 100 supported on an inner side of the outer cylinder 51 and the sample 102 at the tip end of the sample holder 100 operate substantially in the Z-axis direction.

In addition, since a force against the driving force is generated by compressive deformation of the counter spring 53, when the Z-axis operation driving unit 52 performs a contraction operation, the outer cylinder 51 can also move following the operation.

In addition, in order to prevent leakage from the outer cylinder 51 during the operation in the substantially Z-axis direction, it is preferable to vacuum-seal the outer cylinder 51 with the spherical fulcrum O-ring 56.

The Y-direction operation mechanism includes a movable unit, a driving unit, an operation guide unit, a position measurement unit, and a vacuum sealing unit, and is disposed on the rotation cylinder. The Y-direction operation mechanism can rotate the Z-direction operation mechanism by 90° about the X-axis.

The Y-direction operation mechanism includes the outer cylinder 51 (movable unit) that operates in the substantially Y-axis direction, a Y-axis operation driving unit (not shown) that generates an operation driving force in the substantially Y-axis direction, a counter spring (not shown, driving unit) that generates an against force of the driving force, the spherical receiver 54 and the spherical fulcrum 55 (operation guide unit) that guide an operation in the substantially Y-axis direction, the spherical fulcrum O-ring 56 (vacuum sealing unit), and an encoder (not shown, position measurement unit). Since the driving unit directly acts on the movable unit, a transmission unit is unnecessary.

In order to operate substantially in the Y-axis direction, the Y-axis operation driving unit and the counter spring are fixed on the rotation cylinder 41. The other components are the same as those of the Z-axis operation driving unit.

The operation of the Y-direction operation mechanism 60 will be described below. The Y-axis operation driving unit extends and contracts according to the driving signal from the stage controller 19. The Y-axis operation driving unit may be a linearly moving unit, and may be, for example, a linear actuator. The other operations are the same as those of the Z-direction operation mechanism. Accordingly, the sample holder 100 supported on the inner side of the outer cylinder 51 and the sample 102 at the tip end of the sample holder 100 operate substantially in the Y-axis direction. In addition, since a force against the driving force is generated by compressive deformation of the counter spring, when the Y-axis operation driving unit performs a contraction operation, the outer cylinder 51 can also move following the operation.

Since the outer cylinder 51 is guided by the spherical receiver 54 and the spherical fulcrum 55, the outer cylinder 51 can cope with both the operation in the substantially Z-axis direction (or rotation about the Y-axis) and the operation in the substantially Y-axis direction (or rotation about the Z-axis).

In order to linearly move in the X-axis direction, the X-axis linear movement mechanism 70 includes a movable unit, a driving unit, an operation guide unit, a driving force transmission unit, a position measurement unit, and a vacuum sealing unit, and is disposed on the rotation cylinder 41.

The X-axis linear movement mechanism 70 includes a slide cylinder 72 that linearly moves in the X-axis direction, a holder abutment unit 73 (movable unit), an X-axis linear movement driving unit 74 (driving unit) that generates a linear movement driving force in the X-axis direction, a guide pin 75 and a holder guide groove 76 (operation guide unit) that guide an X-axis linear movement operation, a lever 77 (driving force transmission unit), a holder O-ring 78 and an O-ring between an inner cylinder and the outer cylinder 79 (vacuum sealing unit), an encoder (not shown, position measurement t unit), and an inner cylinder 71. The inner cylinder 71 is formed by, for example, partially fitting and fixing two cylindrical members.

The inner cylinder 71 is disposed on the inner side of the outer cylinder 51, and the slide cylinder 72 is disposed on an inner side of the inner cylinder 71. Further, the slide cylinder 72 is connected to the inner cylinder 71 via a bellows 80. The holder abutment unit 73 is disposed on the inner side of the inner cylinder 71. The holder abutment unit 73 is connected to the slide cylinder 72 via a bellows 81. The guide pin 75 is coupled to the sample holder 100. The lever 77 is disposed on the rotation cylinder 41. In addition, the holder O-ring 78 is disposed between the sample holder 100 and the slide cylinder 72, and the O-ring between the inner cylinder and the outer cylinder 79 is disposed between the outer cylinder 51 and the inner cylinder 71.

The operation of the X-axis linear movement mechanism 70 will be described below. According to the driving signal from the stage controller 19, the X-axis linear movement driving unit 74 such as a linear actuator extends and contracts, and a linear movement force during extension and contraction presses the lever, so that the linear movement force serves as a force point of the lever 77. Then, a point serving as an action point of the lever 77 presses a flange of the slide cylinder 72, so that the slide cylinder 72 linearly moves rearward in the X-axis direction. Accordingly, the sample holder 100 supported on the inner side of the outer cylinder 51 and the sample 102 at the tip end of the sample holder 100 linearly move in the X-axis direction. When the slide cylinder 72 linearly moves forward in the X-axis direction, a vacuum negative pressure can be used.

In addition, in order to prevent leakage between the sample holder 100 and the slide cylinder 72 or between the outer cylinder 51 and the inner cylinder 71 during the X-axis linear movement operation, it is preferable to perform the vacuum sealing by using the holder O-ring 78 or the O-ring between the inner cylinder and the outer cylinder 79.

In the embodiment, the sample stage 16 includes the base 30 that supports the entire sample stage, the X-axis rotation mechanism 40 that rotates about the X-axis, the Z-direction operation mechanism 50 that operates substantially in the Z-axis direction, the Y-direction operation mechanism that operates substantially in the Y-axis direction, and the X-axis linear movement mechanism 70 that linearly moves along the X-axis. However, the configuration of the sample stage 16 is not limited thereto.

FIG. 1 is a cross-sectional side view of the sample holder including the inclination mechanism unit according to the embodiment. (a) of FIG. 1 shows the entire sample holder 100, and (b) of FIG. 1 shows an enlarged view of the vicinity of the tip end of the sample holder 100. The coordinate system is the same as that in FIG. 3. The sample holder 100 is used in a state of being inserted from the insertion unit 101.

The inclination mechanism unit 130 that performs an inclination operation to incline the sample in a front-rear direction is disposed at the tip end of the sample holder 100. The term "incline in a front-rear direction" refers to, for example, rotation in a front-rear and upper-lower plane (rotation about the Y-axis).

The sample holder 100 includes an inclination mechanism driving unit 110 (which is disposed at the rear end of the sample holder 100 and generates a driving force necessary for the inclination operation of the inclination mechanism unit 130), an inclination driving force transmission unit 120 (which includes a rod or a threaded member and transmits the driving force to the tip end of the sample holder 100), and the inclination mechanism unit 130 (which is disposed at the tip end of the sample holder 100 and has a mechanism for inclining the sample in the front-rear direction).

The charged particle beam device 1 includes a guide unit 121 that guides the movement of the inclination driving force transmission unit 120. The guide unit 121 has a hollow tubular shape, and the inclination driving force transmission unit 120 is inserted into a hollow portion of the guide unit 121. With such a structure, a movement direction of the inclination driving force transmission unit 120 is appropriately controlled.

The inclination mechanism unit 130 includes a load transmission unit 140 that transmits a driving force from the inclination driving force transmission unit 120, four deformation units 150 that are elastically deformed by the driving force, and a sample holding unit 160 that holds and is capable of inclining the sample 102.

The load transmission unit 140 includes a first load transmission unit 141 and a second load transmission unit 142 that transmit the driving force from the inclination driving force transmission unit 120. The second load transmission unit 142 can be formed to, for example, a triangular shape or a triangular columnar shape. For example, the second load transmission unit 142 can be supported by the deformation units 150 at vertices of the triangle or in the vicinity thereof. For example, the second load transmission unit 142 can have a structure with high rigidity.

The deformation unit 150 is simply represented by a circular shape in the drawing, but may be any shape as long as the deformation unit 150 can be elastically deformed. For example, a plate spring may be used. In addition, the plate spring may have a folded structure and may have a more easily deformable shape. A specific shape and/or structure of the deformation unit 150 can be appropriately designed by those skilled in the art.

The sample holding unit 160 includes a portion (not shown) for holding the sample. In addition, the plate spring or the like for fixing the sample may be provided.

The deformation unit 150 is a deformation unit that is elastically deformed by a load, and includes a first deformation unit 151, a second deformation unit 152, a third deformation unit 153, and a fourth deformation unit 154.

When the second load transmission unit 142 has a triangular shape, the first deformation unit 151, the second deformation unit 152, and the third deformation unit 153 can be attached to different vertices of the second load transmission unit 142. Accordingly, the second load transmission unit 142 can appropriately support the deformation units with a simple shape.

The first load transmission unit 141 is connected to the inclination driving force transmission unit 120 and the first deformation unit 151. The second load transmission unit 142 is connected to the first deformation unit 151, the second deformation unit 152, and the third deformation unit 153. For example, the first deformation unit 151, the second deformation unit 152, and the third deformation unit 153 are attached to the second load transmission unit 142. The sample holding unit 160 is connected to the third deformation unit 153 and the fourth deformation unit 154.

The first deformation unit 151 is connected to the first load transmission unit 141 and the second load transmission unit 142. Accordingly, a driving force is reliably transmitted between the first load transmission unit 141 and the second load transmission unit 142.

The second deformation unit 152 is connected to the guide unit 121 and the second load transmission unit 142. Accordingly, a fulcrum when the second load transmission unit 142 rotates is fixed.

The third deformation unit 153 is connected to the second load transmission unit 142 and the sample holding unit 160. Accordingly, a driving force is reliably transmitted between the second load transmission unit 142 and the sample holding unit 160.

The fourth deformation unit 154 is connected to the guide unit 121 and the sample holding unit 160. Accordingly, a fulcrum when the sample holding unit 160 rotates is fixed.

The first deformation unit 151 and the second deformation unit 152 are disposed behind the third deformation unit 153. The fourth deformation unit 154 is in front of the third deformation unit 153. The first deformation unit 151 and the fourth deformation unit 154 are both disposed below the second deformation unit 152 and the third deformation unit 153.

The third deformation unit 153 is above the first deformation unit 151 and the fourth deformation unit 154, below the second deformation unit 152, in front of the first deformation unit 151, and behind the fourth deformation unit 154.

The operation of the inclination mechanism configured as described above will be described. The inclination mechanism driving unit 110 using a motor or the like generates a rotation force or a linear movement driving force. The force is transmitted to the inclination driving force transmission unit 120. The inclination mechanism driving unit 110 transmits the driving force to the inclination mechanism unit 130 by directly linearly moving in the front-rear direction or linearly moving in the front-rear direction while rotating.

In the inclination mechanism unit 130, first, the first load transmission unit 141 receives a linear movement force. The first load transmission unit 141 moves in a load direction by a load from the inclination driving force transmission unit 120, and for example, advances according to guidance of the guide unit 121. Accordingly, the first load transmission unit 141 transmits the load to the first deformation unit 151. The first deformation unit 151 is deformed by a load from the first load transmission unit 141.

A force generated by the deformation of the first deformation unit 151 acts on the second load transmission unit 142 at the force point of the lever. The second load transmission unit 142 transmits the load to the third deformation unit 153 by rotating about the second deformation unit 152 as a fulcrum by a torque generated by the deformation of the first deformation unit 151. An action force of the second load transmission unit 142 at this time is transmitted to the third deformation unit 153, and the third deformation unit 153 is deformed.

A force generated by the deformation of the third deformation unit 153 acts on the sample holding unit 160 at the force point of the lever. The sample holding unit 160 rotates about the fourth deformation unit 154 as a fulcrum in a direction (counterclockwise in the example of FIG. 1(*b*)) opposite to a direction of the second load transmission unit 142 due to a torque generated by the deformation of the third deformation unit 153.

When the sample holding unit 160 is rotated in the direction opposite to that in FIG. 1(*b*), a rotation direction of the motor may be reversed.

According to the above configuration, since the charged particle beam device 1 does not have a sliding portion of a rotation shaft, nonlinear characteristics are reduced in the inclination operation of the sample in the charged particle beam device 1. For example, the inclination operation of the sample can be performed only by elastic deformation.

In addition, by eliminating the sliding portion, it is possible to perform an inclination operation without nonlinear characteristics (affecting positioning accuracy) of the mechanism. In addition, since the second load transmission unit 142 has a triangular structure, the rigidity is higher than that of a parallel link structure, and the second load transmission unit 142 has a structure having high vibration resistance.

REFERENCE SIGNS LIST

1: charged particle beam device
16: sample stage (sample insertion structure)
19: stage controller (control unit)
100: sample holder (sample insertion structure)
101: insertion unit
102: sample
110: inclination mechanism driving unit
120: inclination driving force transmission unit
121: guide unit
130: inclination mechanism unit
140: load transmission unit
141: first load transmission unit
142: second load transmission unit
150: deformation unit
151: first deformation unit
152: second deformation unit
153: third deformation unit
154: fourth deformation unit
160: sample holding unit

The invention claimed is:

1. A charged particle beam device comprising:

an inclination mechanism driving unit configured to generate a driving force;

an inclination driving force transmission unit configured to transmit the driving force; and an inclination mechanism unit configured to perform an inclination operation, wherein the inclination mechanism unit includes a first load transmission unit and a second load transmission unit configured to transmit a load from the inclination driving force transmission unit, a first deformation unit, a second deformation unit, a third deformation unit, and a fourth deformation unit configured to be elastically deformed by the load, and a sample holding unit configured to hold and incline a sample, the first deformation unit, the second deformation unit, and the third deformation unit are attached to the second load transmission unit, the third deformation unit is above the first deformation unit and the fourth deformation unit, below the second deformation unit, in front of the first deformation unit, and behind the fourth deformation unit, the first load transmission unit is configured to move in a load direction by the load from the inclination driving force transmission unit and transmit the load to the first deformation unit, the second load transmission unit is configured to rotate about the second deformation unit as a fulcrum by a torque generated by deformation of the first deformation unit and transmit the load to the third deformation unit, and the sample holding unit is configured to rotate about the fourth deformation unit as a fulcrum in a direction opposite to a direction of the second load transmission unit by a torque generated by deformation of the third deformation unit.

2. The charged particle beam device according to claim 1, further comprising:

a sample stage including an insertion unit, wherein the insertion unit is configured to operate to insert the inclination mechanism unit into the charged particle beam device.

3. The charged particle beam device according to claim 1, further comprising a control unit configured to transmit a control signal for controlling the inclination mechanism unit.

4. The charged particle beam device according to claim 1, wherein the second load transmission unit has a triangular shape, and the first deformation unit, the second deformation unit, and the third deformation unit are attached to different vertices of the second load transmission unit.

5. The charged particle beam device according to claim 1, further comprising:

a guide unit configured to guide movement of the inclination driving force transmission unit.

6. The charged particle beam device according to claim 5, wherein the guide unit has a hollow tubular shape, and the inclination driving force transmission unit is inserted into a hollow portion of the guide unit.

7. The charged particle beam device according to claim 1, wherein the first deformation unit is connected to the first load transmission unit and the second load transmission unit.

8. The charged particle beam device according to claim 5, wherein the second deformation unit is connected to the guide unit and the second load transmission unit.

9. The charged particle beam device according to claim 1, wherein the third deformation unit is connected to the second load transmission unit and the sample holding unit.

10. The charged particle beam device according to claim 5, wherein the fourth deformation unit is connected to the guide unit and the sample holding unit.

11. A sample holder comprising:

an inclination mechanism driving unit configured to generate a driving force;

an inclination driving force transmission unit configured to transmit the driving force; and an inclination mechanism unit configured to perform an inclination operation, wherein the inclination mechanism unit includes a first load transmission unit and a second load transmission unit configured to transmit a load from the inclination driving force transmission unit, a first deformation unit, a second deformation unit, a third deformation unit, and a fourth deformation unit configured to be elastically deformed by the load, and a sample holding unit configured to hold and incline a sample, the first deformation unit, the second deformation unit, and the third deformation unit are attached to the second load transmission unit, the third deformation unit is above the first deformation unit and the fourth deformation unit, below the second deformation unit, in front of the first deformation unit, and behind the fourth deformation unit, the first load transmission unit is configured to move in a load direction by the load from the inclination driving force transmission unit and transmit the load to the first deformation unit, the second load transmission unit is configured to rotate about the second deformation unit as a fulcrum by a torque generated by deformation of the first deformation unit and transmit the load to the third deformation unit, and the sample holding unit is configured to rotate about the fourth deformation unit as a fulcrum in a direction opposite to a direction of the second load transmission unit by a torque generated by deformation of the third deformation unit.

12. A sample insertion structure comprising:

a sample holder; and a sample stage, wherein the sample holder includes an inclination mechanism driving unit configured to generate a driving force, an inclination driving force transmission unit configured to transmit the driving force, and an inclination mechanism unit configured to perform an inclination operation, the sample holder is configured to be inserted into the sample stage, the inclination mechanism unit includes a first load transmission unit and a second load transmission unit configured to transmit a load from the inclination driving force transmission unit, a first deformation unit, a second deformation unit, a third deformation unit, and a fourth deformation unit configured to be elastically deformed by the load, and a sample holding unit configured to hold and incline a sample, the first deformation unit, the second deformation unit, and the third deformation unit are attached to the second load transmission unit, the third deformation unit is above the first deformation unit and the fourth deformation unit, below the second deformation unit, in front of the first deformation unit, and behind the fourth deformation unit, the first load transmission unit is configured to move in a load direction by the load from the inclination driving force transmission unit and transmit the load to the first deformation unit, the second load transmission unit is configured to rotate about the second deformation unit as a fulcrum by a torque generated by deformation of the first deformation unit and transmit the load to the third deformation unit, and the sample holding unit is configured to rotate about the fourth deformation unit as a fulcrum in a direction opposite to a direction of the second load transmission unit by a torque generated by deformation of the third deformation unit.

13. A method of controlling a position of a sample using a sample holder, wherein the sample holder includes an inclination mechanism driving unit configured to generate a driving force, an inclination driving force transmission unit configured to transmit the driving force, and an inclination mechanism unit configured to perform an inclination operation, the inclination mechanism unit includes a first load transmission unit and a second load transmission unit configured to transmit a load from the inclination driving force transmission unit, a first deformation unit, a second deformation unit, a third deformation unit, and a fourth deformation unit configured to be elastically deformed by the load, and a sample holding unit configured to hold and incline a sample, the first deformation unit, the second deformation unit, and the third deformation unit are attached to the second load transmission unit, the third deformation unit is above the first deformation unit and the fourth deformation unit, below the second deformation unit, in front of the first deformation unit, and behind the fourth deformation unit, the method comprising:

a step of moving the first load transmission unit in a load direction by the load from the inclination driving force transmission unit and transmitting the load to the first deformation unit;

a step of rotating the second load transmission unit about the second deformation unit as a fulcrum by a torque generated by deformation of the first deformation unit and transmitting the load to the third deformation unit; and a step of rotating the sample holding unit about the fourth deformation unit as a fulcrum in a direction opposite to a direction of the second load transmission unit by a torque generated by deformation of the third deformation unit.

* * * * *